United States Patent
Parsa et al.

(10) Patent No.: US 9,543,735 B2
(45) Date of Patent: Jan. 10, 2017

(54) OPTOELECTRONIC PACKAGES HAVING THROUGH-CHANNELS FOR ROUTING AND VACUUM

(71) Applicant: Texas Instruments Incorporated, Dallas, TX (US)

(72) Inventors: Roozbeh Parsa, Portola Valley, CA (US); William French, San Jose, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/697,768

(22) Filed: Apr. 28, 2015

(65) Prior Publication Data
US 2016/0093761 A1    Mar. 31, 2016

Related U.S. Application Data

(60) Provisional application No. 62/055,827, filed on Sep. 26, 2014.

(51) Int. Cl.
*H01L 31/00*        (2006.01)
*G04F 5/14*        (2006.01)
(Continued)

(52) U.S. Cl.
CPC .......... *H01S 5/02248* (2013.01); *G01R 33/26* (2013.01); *G04F 5/14* (2013.01); *H01L 23/552* (2013.01);
(Continued)

(58) Field of Classification Search
CPC .. H01L 31/167; H01L 31/02005; H01L 31/18; H01L 31/109; H01L 31/02327; H01L 31/0203; H01L 31/024; H01L 31/02325; H01L 23/552; H01L 23/58; H01L 23/4985; H01L 24/49; H01L 24/05; H01L 24/82; H01L 25/162; H01L 25/50; H01L 25/165; H01L 2224/17181; H01L 25/167; G04F 5/14; G01R 33/26; G01R 33/02; G01R 33/03; H01S 5/02453; H01S 5/02248; H01S 5/183; G01F 5/14
See application file for complete search history.

(56) References Cited

U.S. PATENT DOCUMENTS 6,888,374 B2    5/2005   Bal
9,024,397 B2 *   5/2015   Hopper .................... H03L 7/26
                                                                      257/421
(Continued)

*Primary Examiner* — Nikolay Yushin
(74) *Attorney, Agent, or Firm* — Jacqueline J. Garner; Charles A. Brill; Frank D. Cimino

(57) ABSTRACT

A stacked optoelectronic packaged device includes a plurality of stacked components within a package material having a package body providing side walls and a bottom wall for the package, and a lid which seals a top of the package. The stacked components include a first cavity die having a top surface and a bottom surface including at least one through-channel formed in the bottom surface. A bottom die has a top surface including at least one electrical trace and a light source die thereon. At least one of the through-channels of the first cavity die are aligned to the electrical trace, and the first cavity die is bonded to the bottom die with the electrical trace being within the through-channel and not contacting the first cavity die to provide a vacuum sealing structure. A photodetector (PD) is optically coupled to receive the light originating from the light source.

17 Claims, 3 Drawing Sheets

(51) Int. Cl.
    H01S 5/022      (2006.01)
    H01L 23/552     (2006.01)
    H01L 25/16      (2006.01)
    H01L 23/00      (2006.01)
    H01L 31/0232    (2014.01)
    H01L 31/109     (2006.01)
    H01L 25/00      (2006.01)
    G01R 33/26      (2006.01)
    H01L 31/02      (2006.01)
    H01L 31/0203    (2014.01)
    H01L 31/024     (2014.01)
    H01L 31/167     (2006.01)
    H01L 31/18      (2006.01)
    H01S 5/183      (2006.01)
    H01S 5/024      (2006.01)

(52) U.S. Cl.
    CPC ............ *H01L 24/49* (2013.01); *H01L 25/162* (2013.01); *H01L 25/165* (2013.01); *H01L 25/167* (2013.01); *H01L 25/50* (2013.01); *H01L 31/0203* (2013.01); *H01L 31/024* (2013.01); *H01L 31/02005* (2013.01); *H01L 31/02325* (2013.01); *H01L 31/02327* (2013.01); *H01L 31/109* (2013.01); *H01L 31/167* (2013.01); *H01L 31/18* (2013.01); *H01S 5/02453* (2013.01); *H01S 5/183* (2013.01); *H01L 2224/17181* (2013.01)

(56)            References Cited

U.S. PATENT DOCUMENTS

2013/0176703 A1*   7/2013   Hopper ............... H03L 7/26
                                                        361/820
2015/0028866 A1    1/2015   Parsa et al.

* cited by examiner

OPTOELECTRONIC PACKAGES HAVING THROUGH-CHANNELS FOR ROUTING AND VACUUM

CROSS REFERENCE TO RELATED APPLICATIONS

This application claims the benefit of Provisional Application Ser. No. 62/055,827 entitled "Microfabricated atomic clocks (MFAC) & magnetometers (MFAM): high volume manufactural (HVM) magnetic characterization" filed Sep. 26, 2014, which is herein incorporated by reference in its entirety.

FIELD

Disclosed embodiments relate to stacked optoelectronic packages implementing optically pumped sensors or references, such as MFACs and MFAMs.

BACKGROUND

A variety of optoelectronic devices are packaged devices which include a photodetector (PD) and at least one light source that are operated under a vacuum. Conventional MFAC and MFAM packages include a vertically stacked structure inside a package material including a bottom die as a support having electrical traces and at least one light source (e.g., a laser die such as a vertical-cavity surface-emitting laser (VCSEL)) mounted thereon, a first cavity die on the bottom die providing a cavity over the light source, and an optics die on the first cavity die. The electrical traces on the bottom die connect an external driver which drives the light source and includes traces for a resistive heater, such as to provide heat to heat the light source die to a temperature above 50° C., for example to a temperature between 60° C. and 80° C. A second cavity die is on a sealing die that is on the optics die, and a photodetector (PD) die is in a location to be coupled to receive the light originating from the light source. The package is a vacuum sealed package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize the first cavity die being partially over and thus on top of and thus contacting electrical traces (or routing lines) on the top side surface of the bottom die for stacked optoelectronic packaged devices (optoelectronic packaged devices), such as electrical traces for connecting an external driver to a light source on the bottom die, can result in tilting of the optical stack due to the electrical traces creating localized raised regions under portions of the first cavity die. Tilting of the optical stack is recognized to interfere with needed vacuum in the cavity region over the light source which can degrade performance of the optoelectronic packaged device.

Disclosed embodiments include partial stacks having a die-to-die vacuum sealing structure comprising a first cavity die and a bottom die, wherein the bottom die includes electrical traces on its top surface. The first cavity die includes at least one through-channel formed in its bottom surface, at least one of which is aligned with an electrical trace on the bottom die so that the when the first cavity die is bonded to the bottom die, the size of the through-channel accommodates the electrical trace(s) therein so that the electrical trace(s) do not contact the first cavity die. This feature eliminates tilting of the first cavity die enabling improved stacking to provide a more fully vacuum-sealed package architecture, such as for improving performance for optoelectronic packaged devices including microfabricated atomic clocks (MFAC), microfabricated magnetometers (MFAM), and motion sensor devices.

BRIEF DESCRIPTION OF THE DRAWINGS

Reference will now be made to the accompanying drawings, which are not necessarily drawn to scale, wherein.

DETAILED DESCRIPTION

Figure 1:
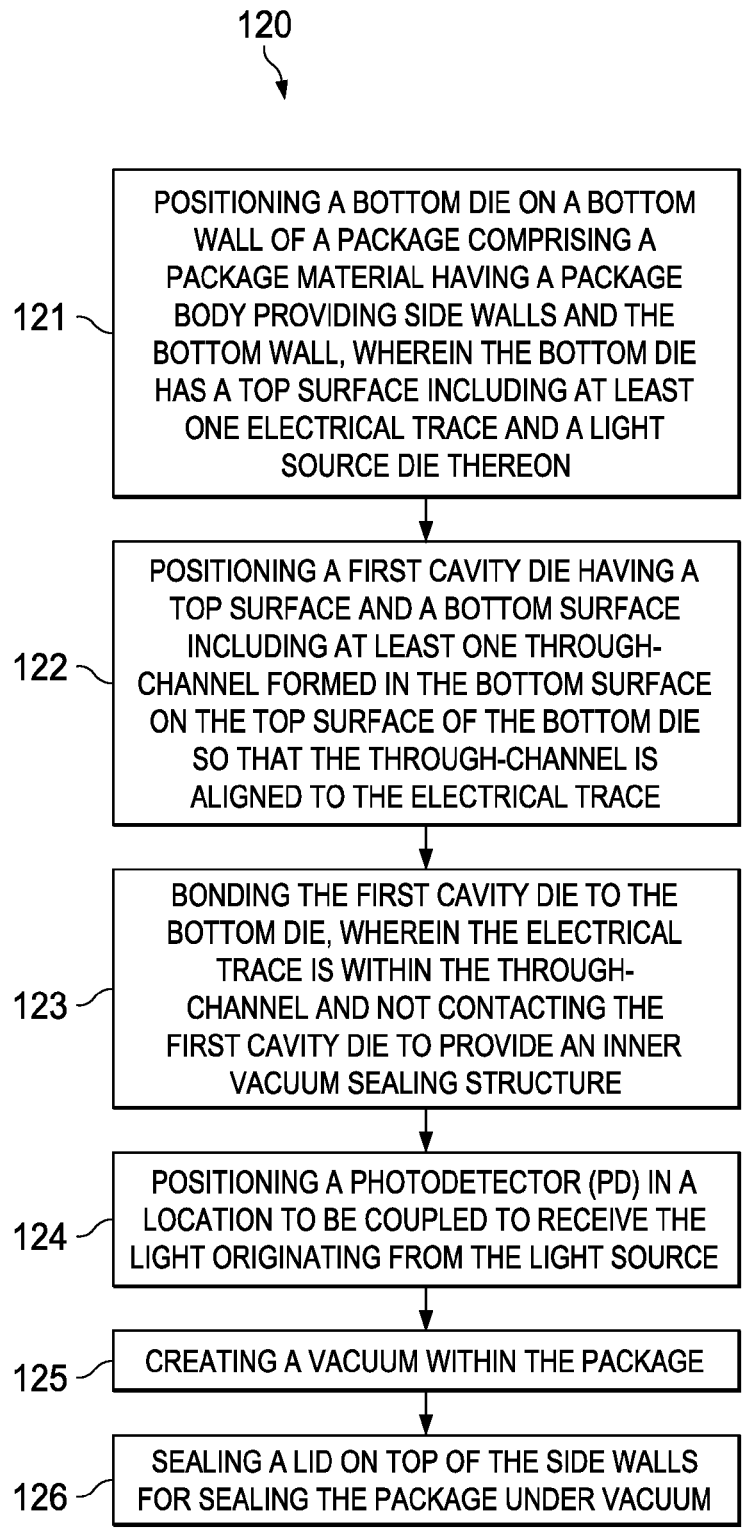
FIG. 1 is a flow chart that shows steps in an example method for forming an optoelectronic packaged device using a first cavity die having through-channel(s) aligned to electrical trace(s) on the top surface of the bottom die and sized to not contact the electrical trace(s), according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 120 for forming an optoelectronic packaged device enabled by a partial stack comprising a first cavity die having through-channel(s) on its bottom surface aligned to electrical trace(s) on the top surface of the bottom die and sized to not contact the electrical trace(s), according to an example embodiment. Disclosed partial stacks thus enable precise stacking of the first cavity die and bottom die.

Step 121 comprises positioning the bottom die on a bottom wall of a package comprising a package material (e.g., plastic or ceramic) having a package body providing side walls and the bottom wall. Standard pick-and-place may be used for this positioning and other die positioning described herein. The bottom die has a top surface including at least one electrical trace and a light source die for emitting light thereon. The light source die can comprise a vertical-cavity surface-emitting laser (VCSEL). The electrical traces generally include electrical traces for coupling an external driver to drive the light source and traces configured to realize a resistive heater.

Step 122 comprises positioning the first cavity die having a bottom surface including at least one through-channel formed in the bottom surface on the top surface of the bottom die so that the through-channel(s) is aligned to the electrical trace(s). As a particular example, the through-channels can be simultaneously formed on a plurality of first cavity die on a silicon wafer using a hydroxide-based wet etch, such as tetramethylammonium hydroxide (TMAH) or potassium hydroxide (KOH). The wet etch of the silicon wafer can be performed in a self-limiting manner, meaning for a particular aperture size the etch stops itself at or around a desired depth. For instance, when a narrow mask (e.g., photoresist) opening is used to expose the surface of a silicon wafer, wet etching can occur at a suitable angle (such as about 54.74°) so that the wet etching can self-terminate before it etches completely through the thickness of the silicon wafer. A self-terminating etch results in a through-channel having a maximum width at the surface with a width decreasing across its height linearly until it is zero.

Dry etching (e.g. reactive ion etching (RIE)) or plasma etching may also be used to form the through-channels which will generally have a near-constant width across their height. The height of the through-channel can be at least 2 µm greater than a thickness of the electrical trace and the minimum width of the through-channel throughout a thickness of the electrical trace can be at least 20 µm greater than a width of the electrical trace. The first cavity die can in another embodiment comprise glass.

The electrical traces can comprise a first plurality of electrical traces and the through-channels can comprise a second plurality of through-channel, where all of the plurality of electrical traces are collectively within the second plurality of through-channels. One or more electrical traces can be in each through-channel.

Step 123 comprises bonding the first cavity die to the bottom die, wherein the electrical trace is within the through-channel and not contacting the electrical trace to provide an inner vacuum sealing structure which enables precise stacking of the first cavity die and bottom die. Disclosed embodiments thus avoid tilt in the optical stack caused by electrical traces on the top surface of the bottom die conventionally being on top of and thus contacting the first cavity die, thus creating a partial stack that enables precise stacking of the first cavity die and bottom die, a fully vacuum-sealed optical package architecture having good mechanical stability. In one embodiment an epoxy (or other adhesive) is used for the bonding.

Step 124 comprises positioning a photodetector (PD) die in a location to be coupled to receive the light originating from the light source, such as in a line-of sight with the light originating from the light source. For example, the PD die can be mounted on a base portion of an inner package that is inside the package, where the inner package having an open top opposite the base portion that faces the bottom wall of the package.

Step 125 comprises creating a vacuum within the package. Step 126 comprises sealing a lid on the top of the side walls of the package for sealing the package under vacuum. The method can further include positioning an optics die on the first cavity die.

Figure 2:
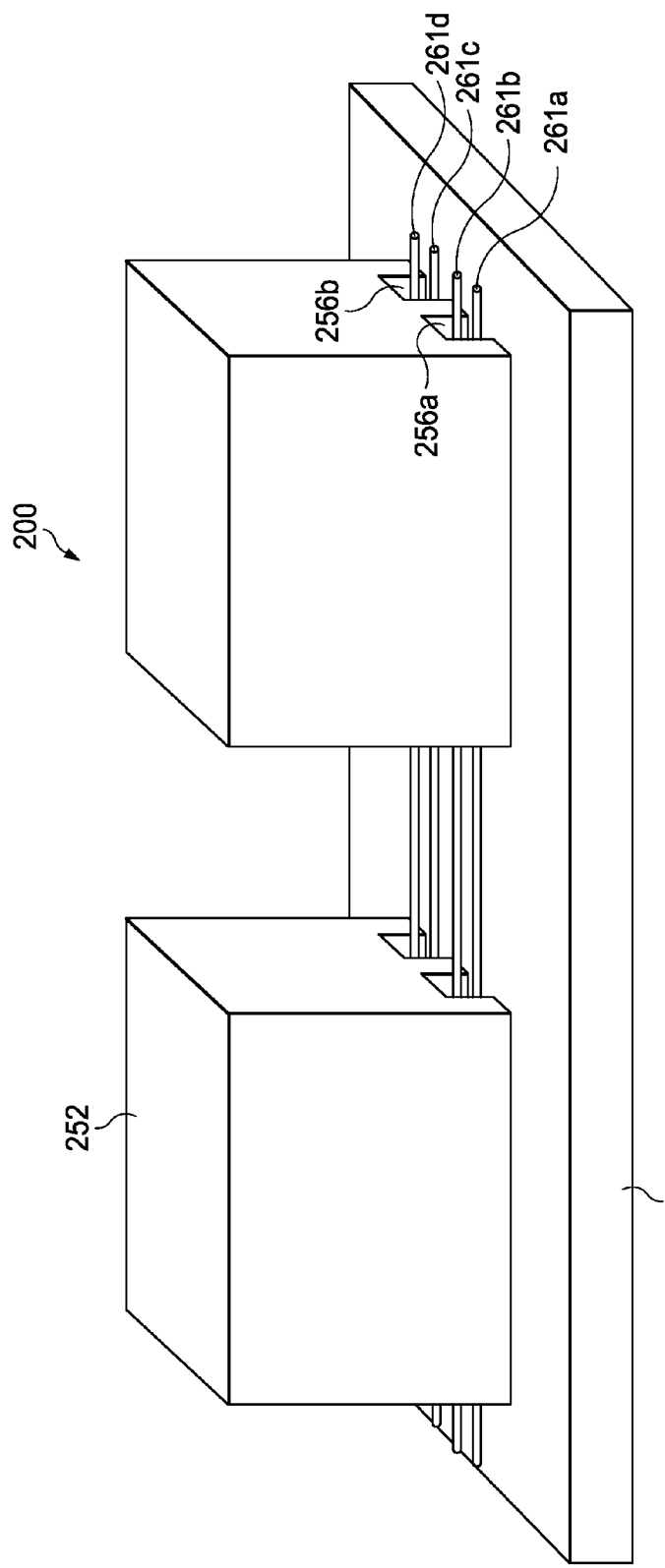
FIG. 2 is a depiction of an example cavity die having etched through-channel(s) for providing routing of electrical lines on the top of the bottom die without causing tilt, enabling a vacuum-packaged structure with good mechanical stability, according to an example embodiment.

FIG. 2 is a cross sectional depiction of an example partial stack 200 comprising a first cavity die 252 bonded to the top surface of the bottom die 251 having etched through-channels 256*a* and 256*b* for providing micro-tunnels for routing electrical traces 261*a*, 261*b*, 261*c* and 261*d* on the bottom die 251, according to an example embodiment. Bond pads on the ends of the electrical traces 261*a*, 261*b*, 261*c* and 261*d* are not shown in FIG. 2.

Since the through-channels 256*a* and 256*b* have a sufficient dimension so that the electrical traces 261*a*, 261*b*, 261*c* and 261*d* fit fully within and do not contact the first cavity die 252, the partial stack 200 avoids conventional titling of the first cavity die 252 due to one or more electrical traces being in contact with its bottom side surface. As tilting is avoided by partial stack 200, partial stack 200 enables precise stacking of the first cavity die 252 and bottom die 251 and a vacuum-packaged structure with good mechanical stability for an optoelectronic packaged device including partial stack 200.

Figure 3:
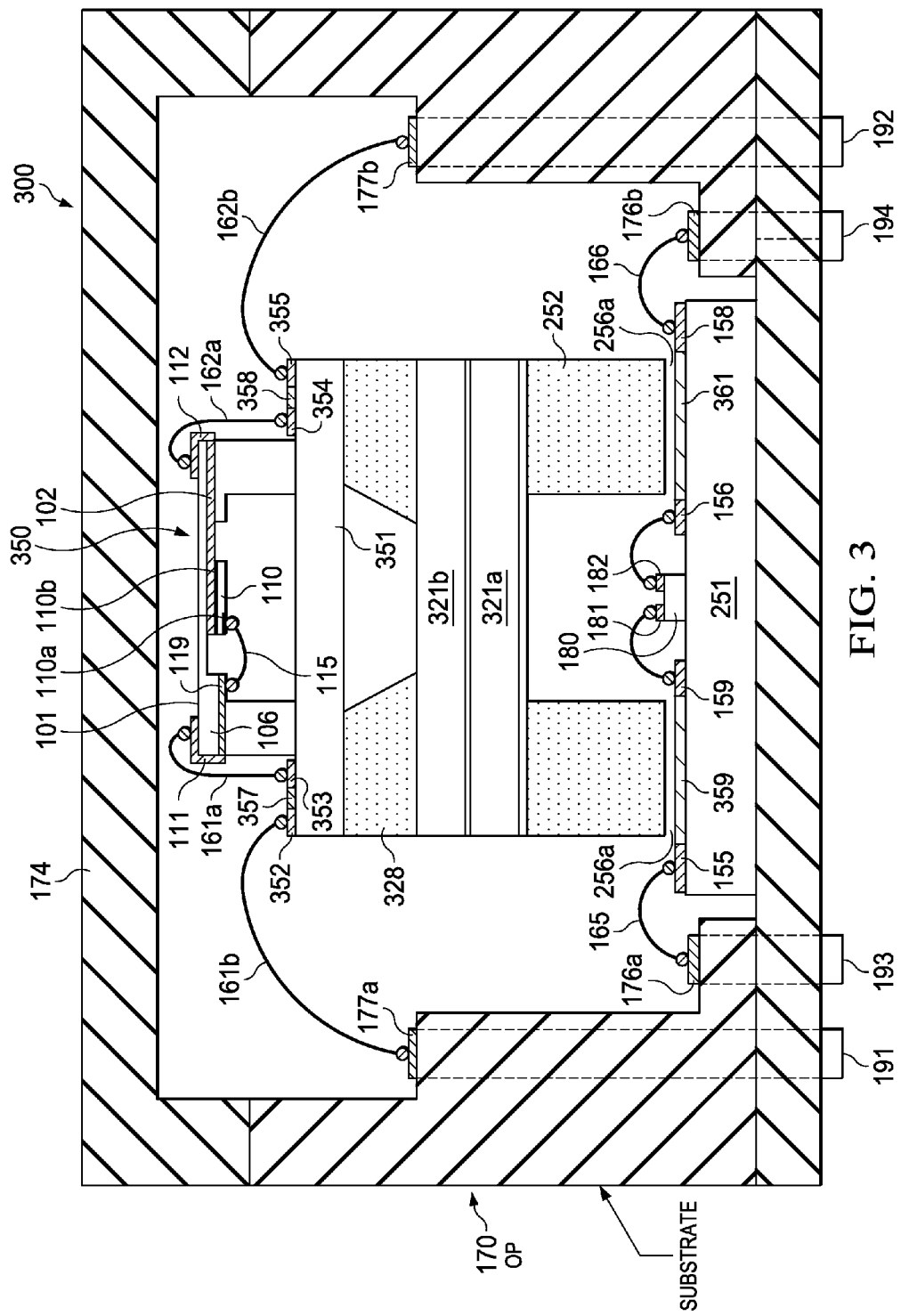
FIG. 3 is an example optoelectronic packaged device including a disclosed first cavity die having a through-channel providing a micro-tunnel for electrical trace(s) on the top surface of the bottom die, where the through-channel is sized to not contact the electrical trace(s), according to an example embodiment.

FIG. 3 is a depiction an example optoelectronic packaged device 300 including a disclosed first cavity die 252 having a through-channel 256*a* providing a micro-tunnel for electrical trace(s) shown as electrical trace 359 with associated bond pads 155 and 159 and electrical trace 361 with associated bond pads 156 and 158 on the top surface of the bottom die 251, where the through-channel 256*a* is sized to be sufficiently large to not contact the electrical traces, according to an example embodiment. As with the partial stack 200 shown in FIG. 2 with the through-channels 256*a*, 256*b* of the first cavity die 252 having sufficient dimensions so that the electrical traces shown fit fully within, electrical traces 359 and 361 fit fully within and do not contact the first cavity die 252 in FIG. 3 so that the partial stack enables precise stacking of the first cavity die and bottom die and avoids titling of the first cavity die 252 due to one or more electrical traces being in contact with its bottom side surface enabling a vacuum-packaged structure for optoelectronic packaged device 300 with good mechanical stability. Optoelectronic packaged device 300 is shown including an inner package 350 inside an outer package (OP) 170. The inner package 350 has an open top opposite its base portion that faces the bottom wall of the package.

The PD die 110 includes a first contact comprising a front contact 110*a* connected to a first external bond pad (FEBP) 111 by routing comprising an internal bond wire 115. The PD die 110 also includes a second contact comprising a back contact 110*b* connected by routing comprising a back side metal layer 102 to a second external bond pad (SEBP) 112.

The inner package 350 shown includes a multi-layer first dielectric substrate including a first dielectric level 101, and a second dielectric level 106 above the first dielectric level 101. As known in the art, the multi-layer first dielectric substrate can be an integral (one-piece) substrate so that the first dielectric level 101 and second dielectric level 106, together with any intervening metal layer, are configured without the need for any adhesive. For example, ceramic packages have build-up layers that allow integrated metal connections laterally and vertically to the reach the outer surface of the package.

The first dielectric level 101 includes a top side including a first die attach area having back side metal layer 102 thereon extending to a first outer edge of the inner package 350, and the FEBP 111 and SEBP 112 extend over a portion of a bottom side of the first dielectric level 101. The second dielectric level 106 is above the first dielectric level 101 framing the die attach area including a wire bonding area having a second metal layer 119 extending to the second outer edge of the inner package 350.

The front contact 110*a* can comprise bond pad metal connected to an n+ region and the back contact 110*b* can comprise bond pad metal connected to a p+ region. The back contact 110*b* can be the entire bottom side of the PD die 110. The internal bond wire 115 connects the front contact 110*a* to the second metal layer 119.

The PD die 110 can comprise any suitable front-side illuminated PD including a photodiode, a phototransistor or a charge-coupled device (CCD), which all can be off-the-shelf PD die. In one embodiment the PD die 110 includes a first active layer having a first conductivity (e.g., n+), a second active layer having a second conductivity (e.g., p+) opposite the first conductivity, and an intrinsic layer separating the first and second active layers (to form a PIN diode).

The inner package 350 is on a second mounting substrate 351 that includes bond pads 352 and 353 coupled together by the metal trace shown 357, and bond pads 354 and 355 coupled together by the metal trace 358 shown. Bond wire 161a connects the FEBP 111 to bond pad 353 and bond wire 161b connects the bond pad 352 to upper wire bond area 177a. Bond wire 162a connects the SEBP 112 to bond pad 354 and bond wire 162b connects bond pad 355 to upper wire bond area 177b.

First bond wires shown as bond wire 161a and bond wire 161b together connect the FEBP 111 to the wire bond area 177a which connects the first terminal 191 of the OP 170, second wire bonds 162a and 162b together connect the SEBP 112 to the wire bond area 177b which connects to the second terminal 192 of the OP 170, a third wire bond 165 connects bond pad 155 at the end of metal trace 359 to an outer bond pad 176a which through metal trace 359 and the bond wire between bond pad 159 and first electrode 181 connects to the first electrode 181 to the third terminal 193 of the OP 170, and a fourth wire bond 166 from bond pad 158 to an outer bond pad 176b which through a wire bond from the bond pad 156 at the end of the metal trace 361 connects the second electrode 182 to a fourth terminal 194 of the OP 170. The lid 174 hermetically seals the OP 170.

Optoelectronic packaged device 300 includes a light source die 180 having electrodes 181 and 182 to allow biasing (e.g., electrically pumping) shown in FIG. 3 provided by bond wire 165 from lower bond pad area 176a (connected to third terminal 193) and by bond wire 166 from lower bond pad area 176b (connected to third terminal 194). Light source die 180 can comprise a VCSEL in one specific embodiment. An optically transparent sealing or die sheet (sealing die) 321b on an optics die 321a is shown between the first cavity die 252 and second cavity die 328. The sealing die 321b can comprise an optical glass which seals the lower end of the upper cavity defined by the second cavity die 328 that is sealed on the upper end by a second mounting substrate 351. The second mounting substrate 351 can comprise an optical glass, such as a borosilicate glass, for example BOROFLOAT 33.

Advantages of disclosed embodiments include a structure that avoid tilts in the optical stack caused by electrical traces on the bottom die contacting portions of the first cavity die enabling precise stacking of the first cavity die and bottom die and the creation of a fully vacuum-sealed package architecture that can be produced by processing that is low cost and high throughput via mass manufacturing. Applications for disclosed embodiments generally include all applications having a light source such as a laser diode along with an inbuilt monitor PD that operate under a vacuum. One specific example is a magnetometer physics package. Other examples include an atomic clock, and a motion sensor.

Disclosed embodiments can be integrated into a variety of assembly flows to form a variety of different optoelectronic devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A stacked optoelectronic packaged device, comprising:
a plurality of stacked components within a package comprising a package material having a package body providing side walls and a bottom wall for said package, and a lid for sealing a top of said package, said plurality of stacked components including:
a first cavity die having a cavity, a top surface and a bottom surface including at least one through-channel formed in said bottom surface, each through channel extending from the cavity to an outer edge of the first cavity die;
a bottom die having a top surface including thereon at least one electrical trace and a light source die for emitting light coupled to said electrical trace, wherein the light source is within the cavity and the at least one electrical trace extends on said top surface of the bottom die from a bond pad within the cavity to a bond pad outside of the outer edge of the first cavity die;
wherein at least one of said through-channels of said first cavity die is aligned to said electrical trace;
wherein said first cavity die is bonded to said bottom die;
wherein said electrical trace is within said through-channel and not contacting said first cavity die to provide, with an epoxy, an inner vacuum sealing structure, and
a photodetector (PD) die optically coupled to receive said light originating from said light source die.

2. The stacked optoelectronic packaged device of claim 1, wherein said at least one electrical trace comprises a first plurality of said electrical traces and said at least one of said through-channels comprises a second plurality of said through-channels, wherein all of said first plurality of said electrical traces are collectively within said second plurality of said through-channels.

3. The stacked optoelectronic packaged device of claim 1, further comprising a heater on said top surface of said bottom die.

4. The stacked optoelectronic packaged device of claim 1, wherein a height of said through-channel is at least 2 µm greater than a thickness of said electrical trace and a minimum width of said through-channel throughout a thickness of said electrical trace is at least 20 µm greater than a width of said electrical trace.

5. The stacked optoelectronic packaged device of claim 1, further comprising an optics die on said first cavity die and a sealing die on said optics die.

6. The stacked optoelectronic packaged device of claim 1, wherein said first cavity die comprises glass.

7. The stacked optoelectronic packaged device of claim 1, wherein said first cavity die comprises silicon.

8. The stacked optoelectronic packaged device of claim 1, wherein said PD die is mounted on a base portion of an inner package that is inside said package, wherein said inner package has an open top opposite said base portion that faces said bottom wall of said package.

9. A stacked optoelectronic packaged device, comprising:
a plurality of stacked components within a package comprising a package material having a package body providing side walls and a bottom wall for said package, and a lid for sealing a top of said package, said plurality of stacked components including:
a first cavity die having a cavity, a top surface, and a bottom surface including a through-channel formed in said bottom surface, the through-channel extending from the cavity to an outer edge of the first cavity die;
a bottom die having a top surface including thereon an electrical trace and a light source die for emitting light coupled to said electrical trace, wherein the electrical trace extends on the top surface of the bottom die from a bond pad within the cavity to a bond pad outside of the outer edge of the first cavity die;
wherein said through-channels of said first cavity die is aligned to said electrical trace;
wherein said first cavity die is bonded to said bottom die;
wherein said electrical trace is within said through-channel and not contacting said first cavity die,
an optics die on said first cavity die;
a sealing die on said optics die
a second cavity die on said sealing die, and
a photodetector (PD) die optically coupled to receive said light originating from said light source die.

10. A method of forming a packaged stacked optoelectronic device, comprising:
positioning a bottom die on a bottom wall of a package comprising a package material having a package body providing side walls and said bottom wall, said bottom die having a top surface including an electrical trace and a light source die for emitting light thereon;
positioning a first cavity die having a cavity, a top surface and a bottom surface including a through-channel formed in said bottom surface on said top surface of said bottom die so that said through-channel is aligned to said electrical trace, the electrical trace extending on the top surface of the bottom die from a bond pad within the cavity to a bond pad outside of a perimeter of the first cavity die;
bonding said first cavity die to said bottom die, wherein said electrical trace is within said through-channel and not contacting said first cavity die;
positioning a photodetector (PD) die in a location to be coupled to receive said light originating from said light source die;
creating a vacuum within said package, and
sealing a lid on a top of said side walls for sealing said package under said vacuum.

11. The method of claim 10, further comprising positioning an optics die on said first cavity die, and a sealing die on said optics die.

12. The method of claim 10, wherein said PD die is mounted on a base portion of an inner package that is inside said package, said inner package having an open top opposite said base portion that faces said bottom wall of said package.

13. The method of claim 10, wherein a height of said through-channel is at least 2 µm greater than a thickness of said electrical trace and a width of said through-channel throughout a thickness of said electrical trace is at least 20 µm greater than a width of said electrical trace.

14. The method of claim 10, wherein said first cavity die comprises glass.

15. The method of claim 10, wherein said first cavity die comprises silicon, further comprising self-terminated wet etching to form said through-channel formed in said bottom surface of said first cavity die.

16. The method of claim 10, wherein said electrical trace further comprises a heater on said top surface of said bottom die.

17. The method of claim 10, wherein said electrical trace comprises a first plurality of said electrical traces and said through-channels comprises a second plurality of said through-channels, and all of said first plurality of said electrical traces are collectively within said second plurality of said through-channels.

* * * * *